(12) United States Patent
Kim

(10) Patent No.: US 6,996,023 B2
(45) Date of Patent: Feb. 7, 2006

(54) SEMICONDUCTOR MEMORY DEVICE CAPABLE OF REDUCING CURRENT CONSUMPTION IN ACTIVE MODE

(75) Inventor: Yong-Mi Kim, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 173 days.

(21) Appl. No.: 10/744,156

(22) Filed: Dec. 22, 2003

(65) Prior Publication Data

US 2005/0024911 A1  Feb. 3, 2005

(30) Foreign Application Priority Data

Jul. 29, 2003  (KR) .................. 10-2003-0052332

(51) Int. Cl.
*G11C 5/14* (2006.01)
(52) U.S. Cl. ..................... 365/226; 365/227
(58) Field of Classification Search ............... 365/226, 365/227, 228, 229
See application file for complete search history.

(56) References Cited

U.S. PATENT DOCUMENTS

| | | | |
|---|---|---|---|
| 5,394,037 A | 2/1995 | Josephson et al. | |
| 5,399,960 A | 3/1995 | Gross | |
| 5,619,166 A | 4/1997 | Gross | |
| 5,726,941 A * | 3/1998 | Tobita | 365/203 |
| 5,986,959 A * | 11/1999 | Itou | 365/226 |
| 6,016,072 A | 1/2000 | Ternullo, Jr. et al. | |
| 6,094,395 A | 7/2000 | Weinfurtner | |
| 6,188,610 B1 * | 2/2001 | Kakizoe et al. | 365/185.22 |
| 6,222,787 B1 * | 4/2001 | Yoon et al. | 365/226 |
| 6,515,928 B2 * | 2/2003 | Sato et al. | 365/222 |
| 6,532,183 B2 * | 3/2003 | Ooishi | 365/201 |
| 6,560,158 B2 | 5/2003 | Choi et al. | |
| 2002/0159322 A1 | 10/2002 | Choi et al. | |

FOREIGN PATENT DOCUMENTS

KR   1020030002079   1/2003

* cited by examiner

*Primary Examiner*—Tan T. Nguyen
(74) *Attorney, Agent, or Firm*—Blakely Sokoloff Taylor & Zafman

(57) ABSTRACT

There is provided a semiconductor memory device which is capable of reducing a current consumption in an active mode. The semiconductor memory device includes an internal voltage supply block and an internal voltage control block. The internal voltage supplying block is enabled in response to an internal voltage driving enable signal and generates an internal voltage used in an internal operation of the semiconductor memory device. The internal voltage control block activates the internal voltage driving enable signal during a predetermined period after the semiconductor memory device enters an active operation period and during a period corresponding to read/write operations.

12 Claims, 6 Drawing Sheets

SEMICONDUCTOR MEMORY DEVICE CAPABLE OF REDUCING CURRENT CONSUMPTION IN ACTIVE MODE

FIELD OF THE INVENTION

The present invention relates to a semiconductor memory device; and, more particularly, to a semiconductor memory device that is capable of reducing a current consumption in an active mode.

DESCRIPTION OF THE PRIOR ART

Generally, a power supply voltage (VDD) and a ground voltage (VSS) are supplied to a memory device and the memory device generates an internal voltage that is necessary for an internal operation.

The voltage necessary for the internal operation of the memory device is a core voltage (Vcore) used in a memory core area, a peripheral internal voltage (Vperi) used in a peripheral circuit disposed adjacent to the core, a high voltage (Vpp) used to drive a word line or in an overdriving, and the like.

FIG. 1 is a block diagram of a conventional memory device, showing a block for generating an internal voltage used for an internal operation of the memory device.

Referring to FIG. 1, the conventional memory device includes a band gap reference circuit 10, a first reference voltage generating circuit 21, a second reference voltage generating circuit 22, a core voltage generating circuit 31, a peripheral internal voltage generating circuit 32, a high voltage generating circuit 33, and an internal voltage controller.

The band gap reference circuit 10 configured to receive an external voltage Vext to generate a band gap reference voltage Vbg. The first reference voltage generating circuit 21 configured to receive the band gap reference voltage Vbg to generate a first reference voltage Vref1 of a predetermined voltage level. The second reference voltage generating circuit 22 configured to receive the band gap reference voltage Vbg to generate a second reference voltage Vref2 of a predetermined voltage level. The core voltage generating circuit 31 configured to receive the first reference voltage Vref1 to generate a core voltage Vcore used in a memory core area. The internal voltage generating circuit 32 configured to receive the second reference voltage Vref2 to generate an internal voltage Vperi used in a peripheral area of the memory core area. The high voltage generating circuit 33 configured to detect a high voltage level to generate a high voltage Vpp of a predetermined level. The internal voltage controller 40 configured to generate an internal voltage driving enable signal act_i for enabling the core voltage generating circuit 31, the internal voltage generating circuit 32 and the high voltage generating circuit 33.

FIG. 2 is a block diagram of the internal voltage controller 40 shown in FIG. 1.

Referring to FIG. 2, the internal voltage controller 40 includes an input unit 41 for transferring an active signal ratv and a precharge signal rpcg, a latch unit 42 for latching a signal transmitted from the input unit 41, and an output unit 43 enabled in response to a clock enable signal cke to buffer and output the latched signal of the latch unit 42.

FIG. 3 is a waveform showing an operation of the memory device of FIG. 1.

Hereinafter, an operation of the conventional semiconductor memory device will be described with reference to FIGS. 1 to 3.

First, the band gap reference circuit 10 receives the external voltage Vext to generate the band gap reference voltage Vbg that maintains a predetermined level. Typically, a level of the external voltage is unstable and fluctuating. The band gap reference circuit 10 functions to generate the band gap reference voltage Vbg that always maintains a stable level without regard to the level fluctuation of the external voltage Vext.

The first reference voltage generating circuit 21 receives the band gap reference voltage Vbg to generate the first reference voltage Vref1, and the second reference voltage generating circuit 22 receives the band gap reference voltage Vbg to generate the second reference voltage Vref2. The first and second reference voltages Vref1 and Vref2 are voltages provided by adjusting the band gap reference voltage Vbg by a predetermined voltage level. The first and second reference voltages Vref1 and Vref2 are a standard for generating the internal voltage necessary for the internal operation.

The core voltage generating circuit 31 is enabled in response to the internal voltage driving enable signal act_i and uses the first reference voltage Vref1 to generate the core voltage Vcore used in the memory core area. In addition, the peripheral internal voltage generating circuit 32 is enabled in response to the internal voltage driving enable signal act_i and uses the second reference voltage Vref2 to generate a voltage Vperi used in the peripheral area of the memory core area.

The high voltage generating circuit 33 is enabled in response to the internal voltage driving enable signal act_i and detects a level of the high voltage Vpp to generate a high voltage Vpp of a predetermined level. The high voltage Vpp is a voltage that maintains a higher level than the external voltage Vext. The high voltage is used to drive a word line or to perform an overdriving operation.

The internal voltage controller 40 is enabled in response to a power-up signal pwrup to generate the internal voltage driving enable signal for enabling the core voltage generating circuit 31, the peripheral internal voltage generating circuit 32 and the high voltage generating circuit 33.

Referring to FIG. 2, if the memory device is in an active state (/CAS and /WE among the command signals are inactivated to a high level, and /CS and /RAS are activated to a low level), the internal voltage driving enable signal act_i is activated to a high level in response to an active signal rat inputted in a pulse form of a low level. If the memory device is in a precharge state, the internal voltage driving enable signal act_i is inactivated to a low level in response to the precharge signal rpcg inputted in a pulse form of a low level. Further, the internal voltage driving enable signal act_i is outputted in a state that the clock internal voltage driving enable signal cke is activated to a high level.

As shown in FIG. 3, the input of the active signal rat in a low level pulse means that the memory device enters the active period, and the input of the precharge signal rpcg in a low level pulse means that the memory device enters the precharge period.

Typically, the memory device enters from the precharge period to the active period and then receives the read/write command to enter the read/write operation period. After the active period is ended, the memory device again enters the precharge period.

Accordingly, the core voltage generating circuit 31, the peripheral internal voltage generating circuit 32 and the high voltage generating circuit 33 are enabled in response to the internal voltage driving enable signal act_i that is activated to a high level during the active period and the read/write operation period. Then, the core voltage generating circuit 31, the peripheral internal voltage generating circuit 32 and the high voltage generating circuit 33 generate the core voltage Vcore, the peripheral voltage Vperi and the high voltage Vpp to the internal circuit of the memory device.

In a state that the memory device enters the active period and a predetermined time elapses, however, if the read/write command is not inputted yet, that is, if any operations are not performed after the word line is activated, there exists a period when the internal voltages, such as the core voltage Vcore, the peripheral voltage Vperi and the high voltage Vpp, need not be generated continuously. This is because the internal voltages, such as the core voltage Vcore, the peripheral voltage Vperi and the high voltage Vpp, are mainly used when the read/write command is inputted after the actual active state and the corresponding operations are then performed.

Accordingly, if the internal voltages, such as the core voltage Vcore, the peripheral voltage Vperi and the high voltage Vpp, are interrupted after the internal voltages are supplied and then the precharge period begins, the unnecessary waste of current is caused.

SUMMARY OF THE INVENTION

It is, therefore, a primary object of the present invention to provide a semiconductor memory device which is capable of reducing a current consumption in an active mode.

In accordance with one aspect of the present invention, there is provided a semiconductor memory device comprising: an internal voltage supplying means enabled in response to an internal voltage driving enable signal, for generating an internal voltage used in an internal operation of the semiconductor memory device; and an internal voltage control means for activating the internal voltage driving enable signal during a predetermined period after the semiconductor memory device enters an active operation period and during a period corresponding to read/write operations.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, the preferred embodiments of the present invention will be described in detail with reference to the accompanying drawings.

Figure 1:
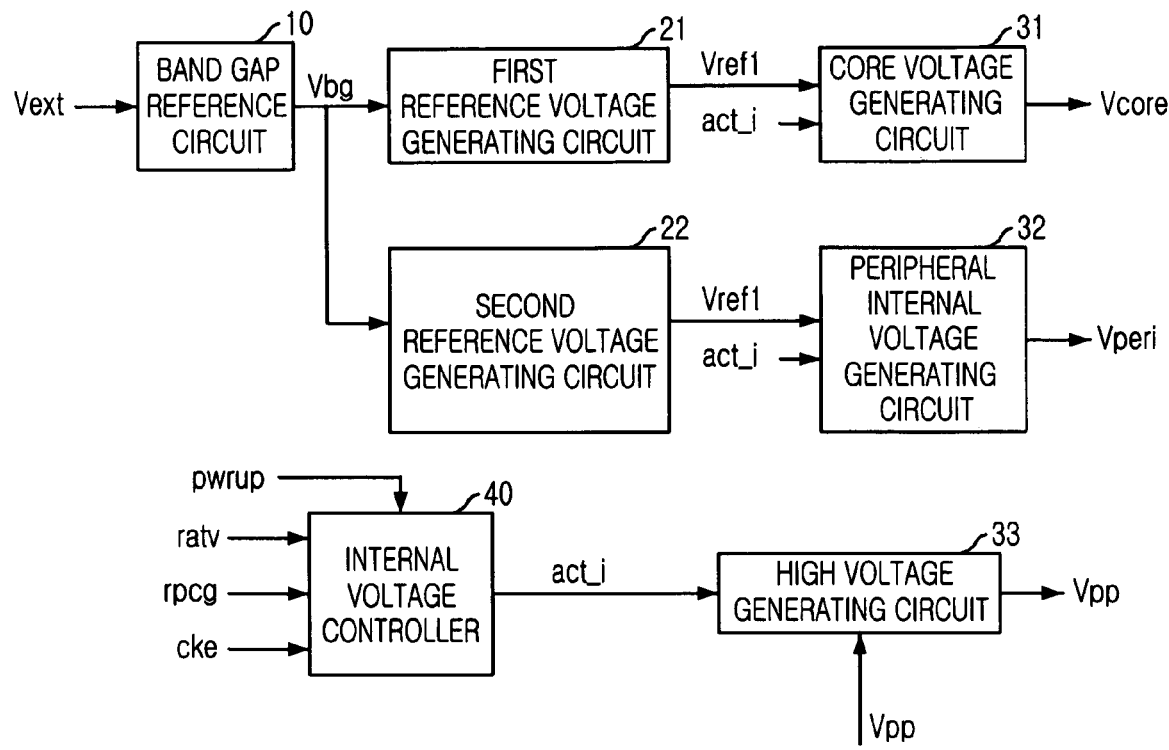
FIG. 1 is a block diagram of a conventional semiconductor memory device.
Figure 2:
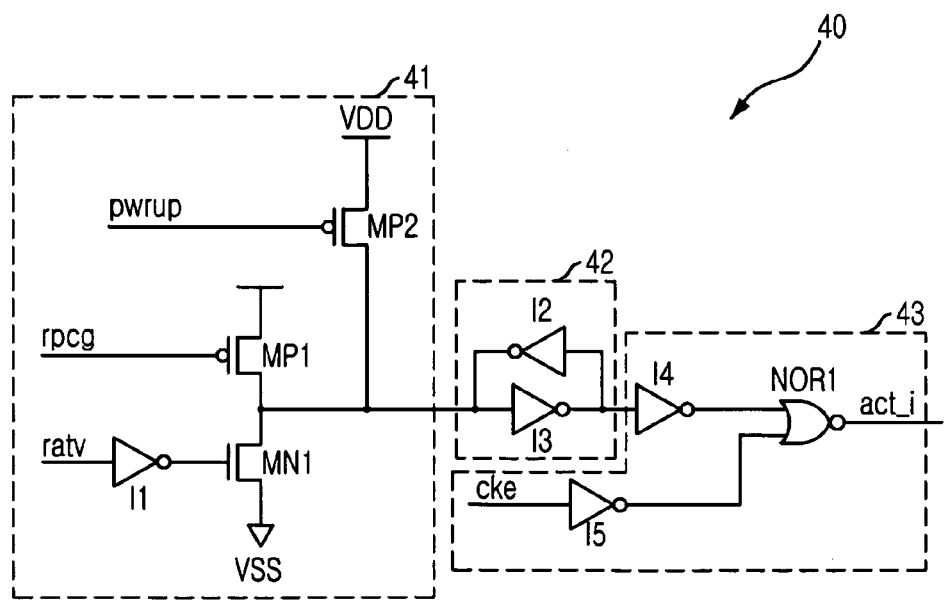
FIG. 2 is a block diagram showing an internal voltage controller of a semiconductor memory device of FIG. 1.
Figure 3:
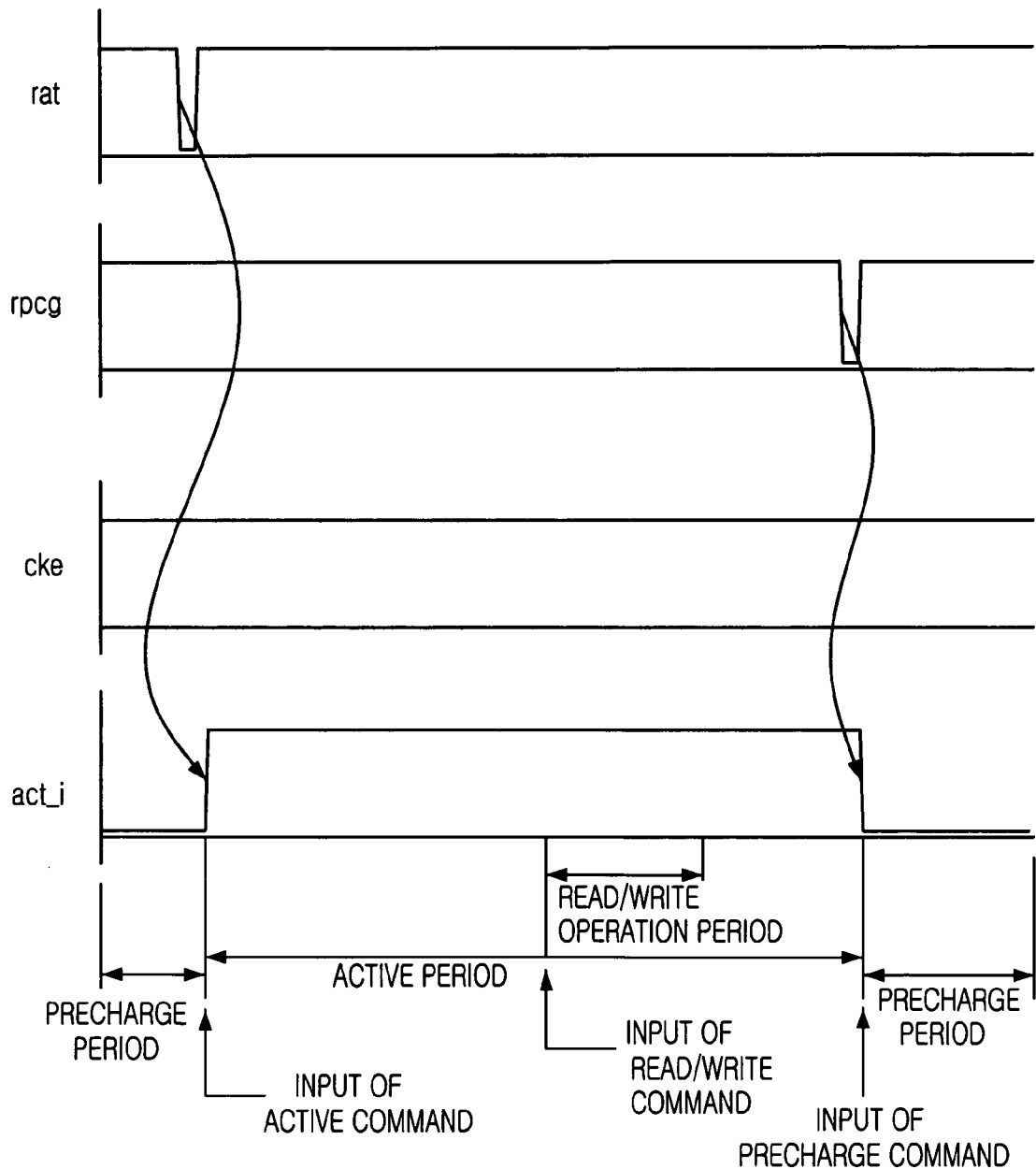
FIG. 3 is a waveform showing an operation of a semiconductor memory device of FIG. 1.
Figure 4:
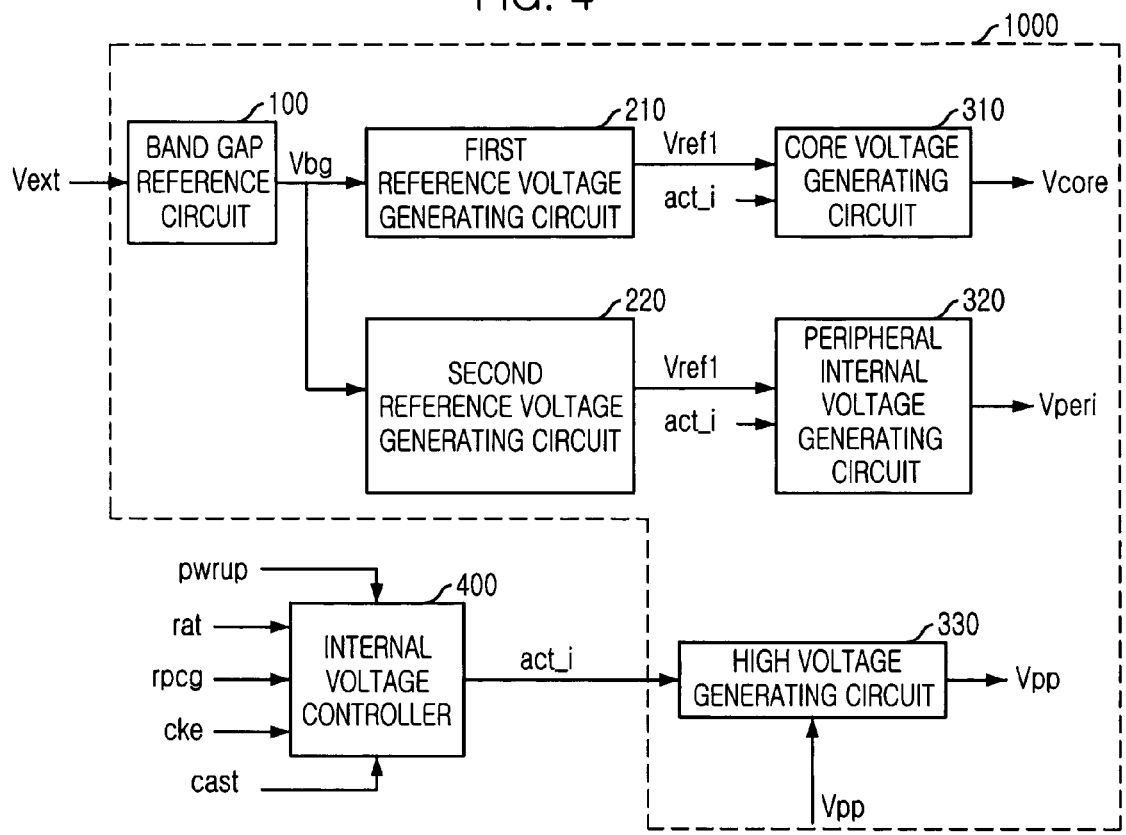
FIG. 4 is a block diagram of a semiconductor memory device in accordance with a preferred embodiment of the present invention.

FIG. 4 is a block diagram of a semiconductor memory device in accordance with a preferred embodiment of the present invention.

Referring to FIG. 4, the semiconductor memory device in accordance with the present invention includes an internal voltage supplying block 1000 and an internal voltage control block 400. The internal voltage supplying block 1000 is enabled in response to an internal voltage driving enable signal act_i and supplies internal voltages Vcore, Vperi and Vpp used for an internal operation of the semiconductor memory device. The internal voltage control block 400 activates and outputs the internal voltage driving enable signal act_i during a predetermined period after the semiconductor memory device enters an active period and during a period corresponding to read/write operations. Here, the predetermined period is a period that can secure a time when the read or write operation is performed after the semiconductor memory device enters the active operation mode. For example, if a time necessary to perform the read or write operation after the semiconductor memory device enters the active operation mode is 50 ns, 50 ns or more are secured during the predetermined period.

Also, the internal voltage supplying block 1000 includes a core voltage generating circuit 310, a peripheral internal voltage generating circuit 320, and a high voltage generating circuit 330.

The core voltage generating circuit 310 is enabled in response to the internal voltage driving enable signal act_i and receives a first reference voltage Vref1 to generate the core voltage Vcore to a memory core area.

The peripheral internal voltage generating circuit 320 is enabled in response to the internal voltage driving enable signal act_i and receives a second reference voltage Vref2 to generate the peripheral internal voltage Vperi to a peripheral area of the memory core area.

The high voltage generating circuit 330 is enabled in response to the internal voltage driving enable signal act_i and generates the high voltage Vpp, a level of which is higher than that of an external power supply voltage Vext.

The internal voltage supplying block 1000 further includes a band gap reference circuit 100, a first reference voltage generating circuit 210, and a second reference voltage generating circuit 220. The band gap reference circuit 100 outputs a band gap reference voltage Vbg of a constant level without regard to a change of the external power supply voltage Vext. The first reference voltage generating circuit 210 receives the band gap reference voltage Vbg to generate the first reference voltage Vref1. The second reference voltage generating circuit 220 receives the band gap reference voltage Vbg to generate the second reference voltage Vref2.

Figure 5:
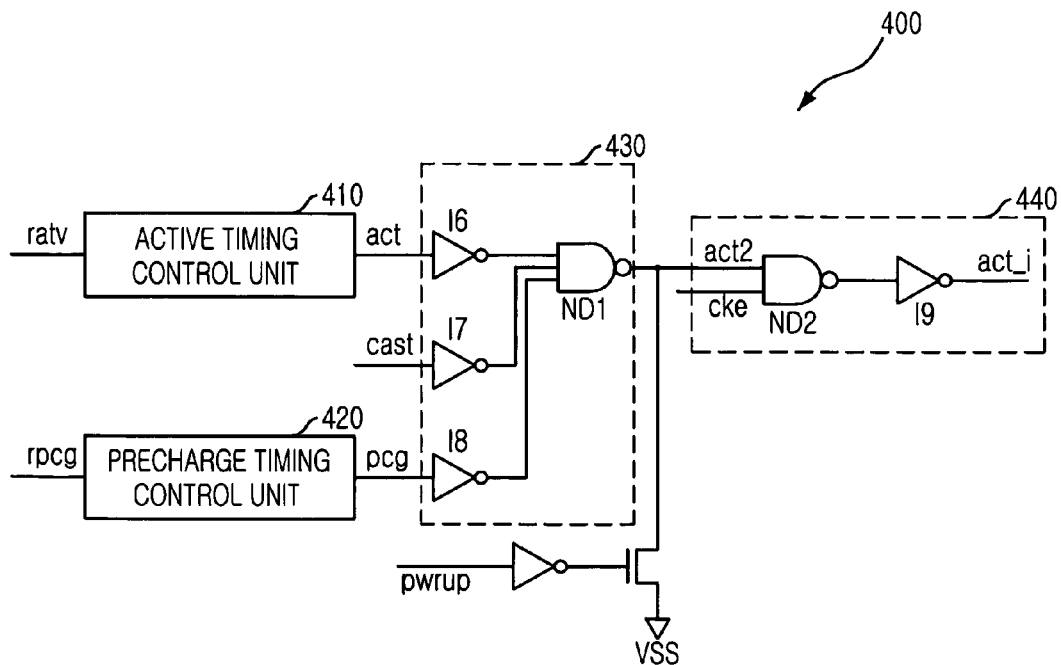
FIG. 5 is a block diagram illustrating an internal voltage controller of a semiconductor memory device of FIG. 4.

FIG. 5 is a block diagram of the internal voltage control block 400 in accordance with an embodiment of the present invention.

Referring to FIG. 5, the internal voltage control block 400 includes an active timing control unit 410, a precharge timing control unit 420, an internal voltage driving control unit 430, and an output unit 440.

The active timing control unit 410 activates and outputs a first output signal act during a first predetermined period in response to an active signal ratv. Here, the active signal ratv is a signal that is activated in an active operation mode.

The precharge timing control unit 420 activates and outputs a second output signal pcg during a second predetermined period in response to a precharge signal rpcg. Here, the precharge signal rpcg is a signal that is activated in a precharge operation mode.

The internal voltage driving control unit 430 activates and outputs a third output signal act2 in response to the first and second output signals act and pcg, and activates and outputs the third output signal act2 during a period corresponding to the read/write operations.

The output unit 440 is enabled in response to an activated clock enable signal cke and buffers the third output signal act2 to output the internal voltage driving enable signal act_i.

Further, the internal voltage control block 400 includes an NMOS transistor for receiving a power-up signal pwrup and fixing an output terminal of the internal voltage driving control unit 430 to a ground voltage VSS.

The first period in which the active timing control unit 410 activates the first output signal act in response to the active signal ratv is set to more than a minimum time in which the operations corresponding to the read or write command can be performed after the semiconductor memory device enters the active period. In other words, it means the minimum time that satisfies "tRAS" in the semiconductor memory device. "tRAS" is the minimum time in which the precharge signal is activated after the semiconductor memory device enters the active period. For example, if "tRAS" is 50 ns, the precharge signal is activated and inputted after at least 50 ns from the entrance of the active period. If the read or write command is inputted after the entrance of the active period, the corresponding operation is performed within 50 ns.

The internal voltage driving control unit 430 includes: an inverter I6 for inverting the first output signal act; an inverter I7 for inverting a driving signal cast that is activated during the period corresponding to the read/write operation; an inverter I8 for inverting the second output signal pcg; and a NDND gate ND2 configured to receive outputs of the inverters I6, I7 and I8 to output the third output signal act2.

The output unit 440 includes a NAND gate ND2 configured to receive the clock enable signal cke and an inverter I9 for inverting an output of the NAND gate ND2 to generate the internal voltage driving enable signal act_i.

Figure 6:
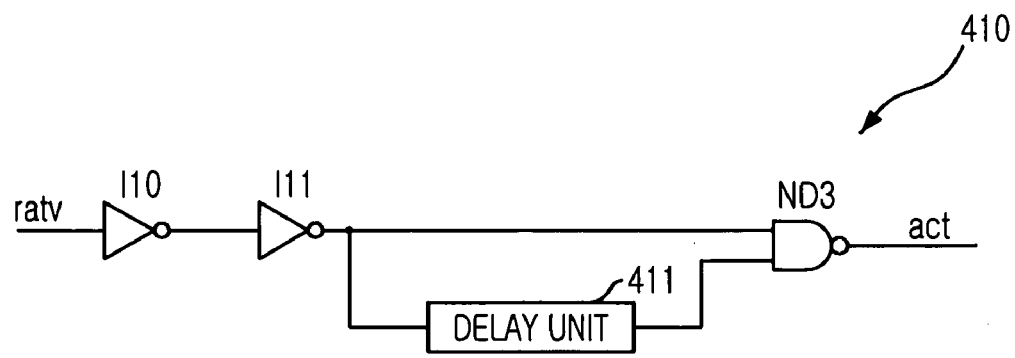
FIG. 6 is a circuit diagram of an active timing control unit shown in FIG. 5.

FIG. 6 is a circuit diagram of the active timing control unit 410 shown in FIG. 5.

Referring to FIG. 6, the active timing control unit 410 includes: two inverters I10 and I11 connected in series to each other, for buffering the active signal ratv; a delay unit 411 for delaying an output of the inverter I11 during the first period; and a NAND gate ND3 configured to receive an output of the inverter I11 and an output of the delay unit 411 to output the first output signal act.

Figure 7:
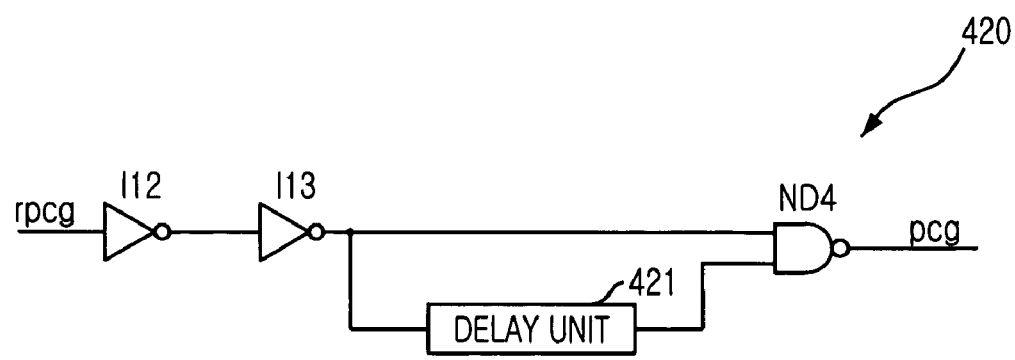
FIG. 7 is a circuit diagram of a precharge timing control unit shown in FIG. 5.

FIG. 7 is a circuit diagram of the precharge timing control unit 420 shown in FIG. 5.

Referring to FIG. 7, the precharge timing control unit 420 includes: two inverters I12 and I13 connected in series to each other, for buffering the precharge signal rpcg; a delay unit 421 for delaying an output of the inverter I13 during the second period; and a NAND gate ND4 configured to receive an output of the inverter I13 and an output of the delay unit 421 to output the second output signal pcg.

Figure 8:
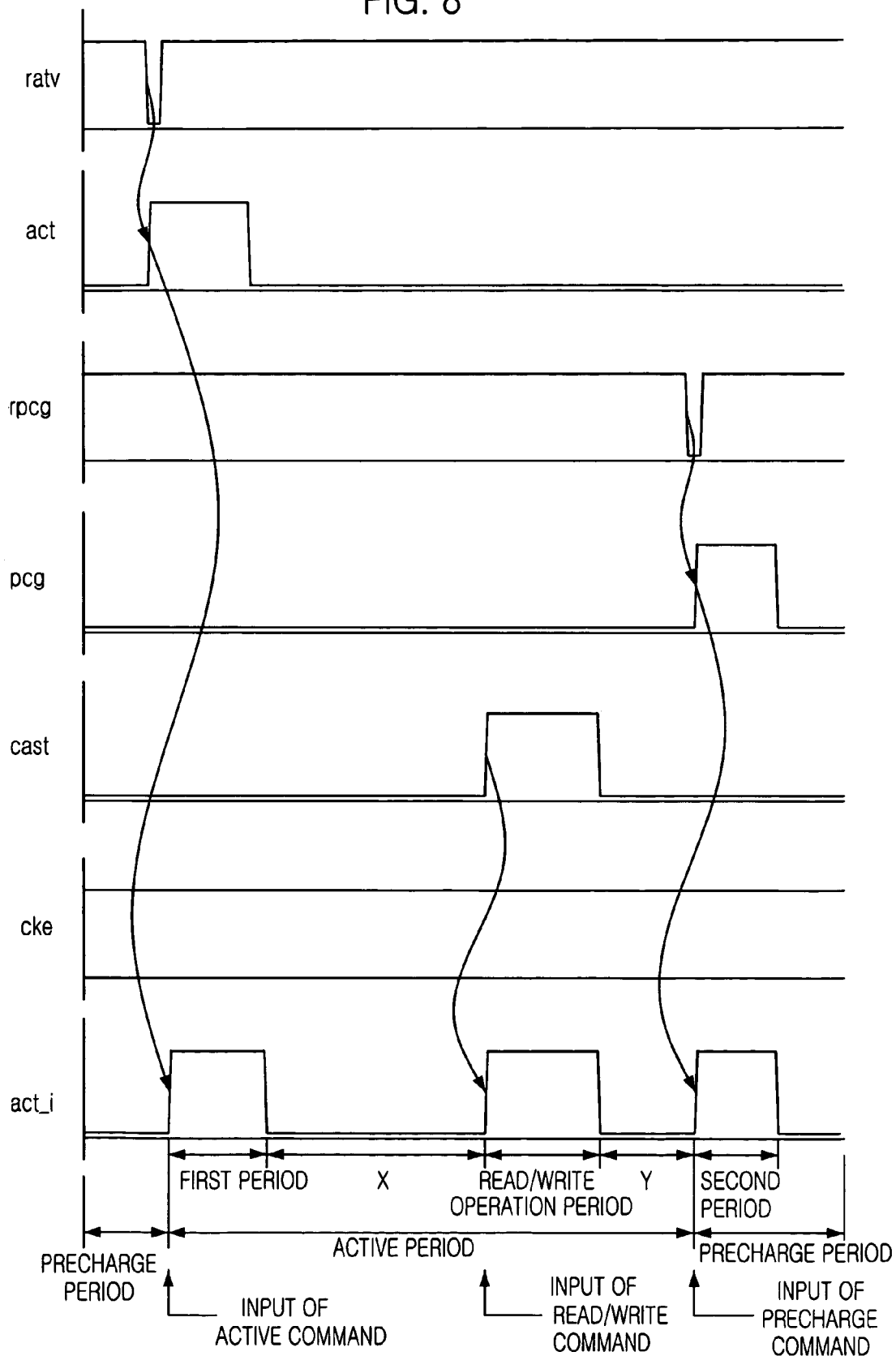
FIG. 8 is a waveform illustrating an operation of a semiconductor memory device of FIG. 5.

FIG. 8 is a waveform illustrating an operation of the semiconductor memory device of FIG. 5. Hereinafter, an operation of the semiconductor memory device in accordance with an embodiment of the present invention will be described in detail with reference to FIGS. 4 to 8.

First, the band gap reference circuit 100 receives the external voltage Vext and generates the band gap reference voltage Vbg maintaining a constant level.

Then, the first reference voltage generating circuit 210 receives the band gap reference voltage Vbg to generate the first reference voltage Vref1, and the second reference voltage generating circuit 220 receives the band gap reference voltage Vbg to generate the second reference voltage Vref2. The first and second reference voltages Vref1 and Vref2 are voltages provided by adjusting the band gap reference voltage Vbg by a predetermined voltage level. The first and second reference voltages Vref1 and Vref2 are a standard for generating the internal voltage necessary for the internal operation.

The core voltage generating circuit 310 uses the first reference voltage Vref1 to generate the core voltage Vcore used in the memory core area. In addition, the peripheral internal voltage generating circuit 320 uses the second reference voltage Vref2 to generate a voltage Vperi used in the peripheral area of the memory core area. The high voltage generating circuit 330 detects the high voltage Vpp to generate the high voltage Vpp of a constant level.

Meanwhile, the internal voltage control block 400 is enabled in response to the power-up signal pwrup and generates the internal voltage driving enable signal act_i for enabling the core voltage generating circuit 310, the peripheral internal voltage generating circuit 320 and the high voltage generating circuit 330.

If the active command is inputted to the semiconductor memory device, the active timing control unit 410 of the internal voltage control block 400 uses the active signal ratv to generate the first output signal act, which is activated to a high level during the first period. Here, the active signal ratv is a signal that is inputted in a form of a low level pulse when the semiconductor memory device is in an active state.

The internal voltage driving control unit 410 buffers the first output signal act to generate the third output signal act2. The output unit 440 buffers the third output signal act2 in a state that the clock enable signal cke is in a high level and outputs the internal voltage driving enable signal act_i of a high level during the first period.

Accordingly, the core voltage generating circuit 310, the peripheral internal voltage generating circuit 320 and the high voltage generating circuit 330 are enabled during the first period and generate the core voltage Vcore, the peripheral voltage Vperi and the high voltage Vpp to the respective parts of the semiconductor memory device, respectively.

Then, the internal voltage driving enable signal act_i is inactivated to a low level after the first period, and thus, the core voltage generating circuit 310, the peripheral internal voltage generating circuit 320 and the high voltage generating circuit 330 are disabled during a next period "x". Accordingly, there is no current consumption in the core voltage generating circuit 310, the peripheral internal voltage generating circuit 320 and the high voltage generating circuit 330 do not consume the current.

Here, it is sufficient if the first period is more than the minimum time. As described above, "tRAS" is the minimum time in which the precharge signal is activated after the active mode. In other words, it means the minimum time in which the read or write command is inputted after the active mode and then the corresponding operation is performed.

It is for the purpose of the normal read/write operation in case the read/write command is inputted just after the entrance of the active mode and the corresponding operation is performed. If the read/write command is not inputted even after the first period, the core voltage generating circuit 310, the peripheral internal voltage generating circuit 320 and the high voltage generating circuit 330 are disabled so that there occurs no current consumption therein.

In other words, the internal voltages, such as the core voltage Vcore, the peripheral internal voltage 320 and the high voltage Vpp, are no longer used during the period "x" in which the read/write command is not inputted even in the active mode.

Then, if the read/write command is inputted during the active period, the corresponding operation is performed. At this point, the internal voltages, such as the core voltage Vcore, the peripheral internal voltage 320 and the high voltage Vpp, are necessary. Therefore, the core voltage generating circuit 310, the peripheral internal voltage generating circuit 320 and the high voltage generating circuit 330 are enabled again.

The internal voltage control block 400 enables and outputs the internal voltage driving enable signal act_i during the period in which the driving signal rast is activated to a high level. Here, the driving signal rast is a signal that is activated while the read or write command is inputted during the active mode and the corresponding operation is then performed.

Then, if the driving signal rast is inactivated, the internal voltage driving enable signal act_i is inactivated so that the core voltage generating circuit 310, the peripheral internal voltage generating circuit 320 and the high voltage generating circuit 330 are disabled (period "Y" of FIG. 8).

If the activated precharge signal rpcg of a low level is inputted, the precharge timing control unit 420 activates and outputs the second output signal pct during the second period.

The internal voltage driving control unit 430 buffers the second output signal pcg to output the third output signal act2. In a state that the clock internal voltage driving enable signal cke is activated to a high level, the output unit 440 of the internal voltage control block 400 buffers the third output signal act2 to generate the internal voltage driving enable signal act_i.

Accordingly, the internal voltage driving enable signal act_i is activated during a predetermined period in which the precharge period starts, i.e., during the second period. Thus, the core voltage generating circuit 310, the peripheral internal voltage generating circuit 320 and the high voltage generating circuit 330 are enabled to the core voltage Vcore, the peripheral internal voltage Vperi and the high voltage Vpp, respectively.

Here, in order to prevent the levels of the internal voltages from being temporarily fluctuating when the respective blocks are changed into the precharge voltage at a timing when the precharge period starts, the internal voltages are supplied by activating the core voltage generating circuit 310, the peripheral internal voltage generating circuit 320 and the high voltage generating circuit 330 during the second period.

Accordingly, the activation of the internal voltage driving enable signal act_i during the second period is not always necessary, and it is for the purpose of the stable maintenance of the precharge voltage during the precharge period.

In the semiconductor memory device in accordance with the present invention, the core voltage generating circuit 310, the peripheral internal voltage generating circuit 320 and the high voltage generating circuit 330 are activated to generate the internal voltages while the operations corresponding to the actual read/write command are performed during the active period, thereby reducing the current consumption used in the active period.

Here, the active state of the memory device is a state that /CAS and /WE among the command signals are inactivated to a high level and /CS and /RAS among the command signals are activated to a low level.

A current consumed during the active period in which the read/write operation is not performed is referred to as "ICC3n" and a current consumed during the precharge period is referred to as "ICC2n". According to the conventional memory device, "ICC3n" is much larger than "ICC2n". On the contrary, according to the present invention, "ICC2n" and "ICC3n" are equal to each other during the period "x" (refer to FIG. 8) in which the internal voltages are not supplied even during the active period, thereby greatly reducing the driving current.

Figure 9:
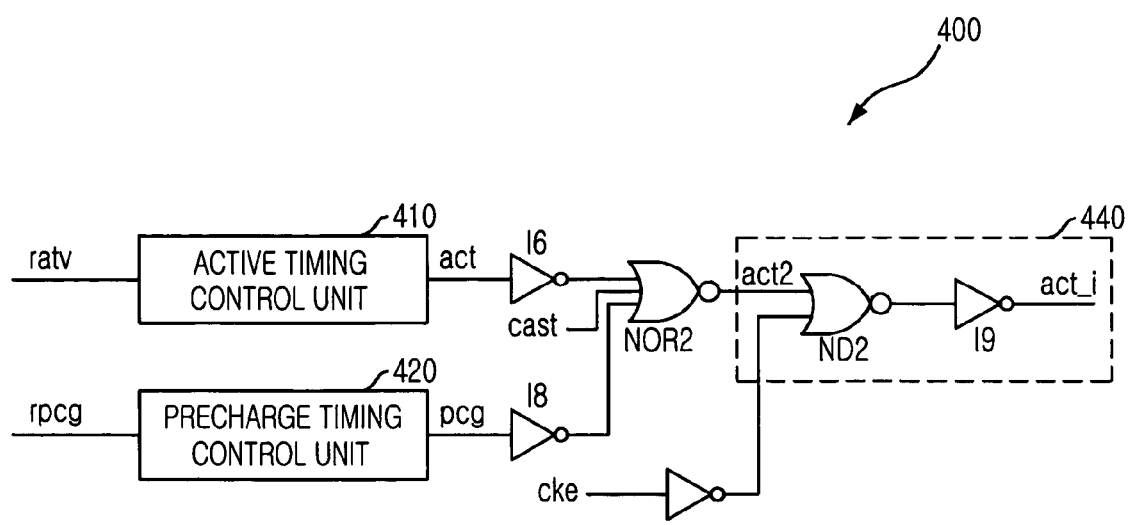
FIG. 9 is a block diagram of an internal voltage control unit of FIG. 4 in accordance with another embodiment of the present invention.

FIG. 9 is a block diagram of an internal voltage control block 400 in accordance with another embodiment of the present invention.

Referring to FIG. 9, the internal voltage driving control unit 430 includes a NOR gate NOR2 for receiving the first output signal act, the driving signal cast activated during the period corresponding to the read/write operation, and the second output signal pcg and generates the third output signal act_i.

Further, the output unit 440 of the internal voltage control block includes a NOR gate NOR3 for receiving the third output signal act2 and the inverted clock enabled signal to generate the internal voltage driving enable signal. Although the internal voltage control blocks of FIGS. 5 and 9 have the different structure from each other, their operations are equal to each other. Therefore, a detailed description about that will be omitted.

As described above, the semiconductor memory device in accordance with the present invention can remarkably reduce the operating current, thus reducing the whole power consumption.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   an internal voltage supplying means enabled in response to an internal voltage driving enable signal, for generating an internal voltage used in an internal operation of the semiconductor memory device; and
   an internal voltage control means for activating the internal voltage driving enable signal during a predetermined period after the semiconductor memory device enters an active operation mode and during a period corresponding to read/write operations.

2. The semiconductor memory device as recited in claim 1, wherein the predetermined period is a period that secures a time when the read or write operation is performed after the semiconductor memory device enters the active operation mode.

3. The semiconductor memory device as recited in claim 1, wherein the internal voltage supplying means includes:
   a core voltage generating circuit enabled in response to the internal voltage driving enable signal, for receiving a first reference voltage to generate a core voltage to a memory core area;
   a peripheral internal voltage generating circuit enabled in response to the internal voltage driving enable signal, for receiving a second reference voltage to generate a peripheral internal voltage to a peripheral area of the memory core area; and a high voltage generating circuit enabled in response to the internal voltage driving enable signal, for generating a high voltage, a level of which is higher than that of an external power supply voltage.

4. The semiconductor memory device as recited in claim 3, wherein the internal voltage supplying means further includes:

a band gap reference circuit for outputting a band gap reference voltage of a constant level without regard to a change of the external power supply voltage;

a first reference voltage generating circuit for receiving the band gap reference voltage to generate the first reference voltage; and a second reference voltage generating circuit for receiving the band gap reference voltage to generate the second reference voltage.

5. The semiconductor memory device as recited in claim 1, wherein the internal voltage control means includes:

an active timing control unit for activating and outputting a first output signal during a first predetermined period in response to an active signal activated in the active operation mode;

a precharge timing control unit for activating and outputting a second output signal during a second predetermined period in response to a precharge signal activated in a precharge operation mode;

an internal voltage driving control unit for activating and outputting a third output signal in response to the first or second output signal and for activating and outputting the third output signal during a period corresponding to the read/write operation; and an output unit enabled in response to an activated clock enable signal, for buffering the third output signal to output the internal voltage driving enable signal.

6. The semiconductor memory device as recited in claim 5, wherein the first period in which the active timing control unit activates the first output signal in response to the active signal is set to more than a minimum time in which the operation corresponding to the read or write command is performed after the semiconductor memory device enters the active operation period.

7. The semiconductor memory device as recited in claim 5, wherein the active timing control unit includes:

a first buffer for buffering the active signal;

a first delay unit for delaying an output of the first buffer during the first period; and a first NAND gate configured to receive the output of the first buffer and an output of the first delay unit to output the first output signal.

8. The semiconductor memory device a recited in claim 7, wherein the precharge timing control unit includes:

a second buffer for buffering the precharge signal;

a second delay unit for delaying an output of the second buffer during the second period; and a second NAND gate configured to receive the output of the second buffer and an output of the second delay unit to output the second output signal.

9. The semiconductor memory device as recited in claim 8, wherein the internal voltage driving control unit includes:

a first inverter for inverting the first output signal;

a second inverter for inverting a driving signal activated during the period corresponding to the read/write operation;

a third inverter for inverting an output of the second output signal; and a third NAND gate configured to receive the outputs of the first to third inverters to output the third output signal.

10. The semiconductor memory device as recited in claim 9, wherein the output unit includes:

a fourth NAND gate configured to receive the clock internal voltage driving enable signal and the third output signal; and a fourth inverter for inverting an output of the fourth NAND gate to output the enable signal.

11. The semiconductor memory device as recited in claim 8, wherein the internal voltage driving control unit includes a NOR gate for receiving the first output signal, the driving signal activated during the period corresponding to the read/write operation, and the second output signal to generate the third output signal.

12. The semiconductor memory device as recited in claim 11, wherein the output unit includes a second NOR gate for receiving the third output signal and an inverted clock internal voltage driving enable signal to output the internal voltage driving enable signal.

* * * * *